(12) United States Patent
Chung

(10) Patent No.: US 8,525,711 B2
(45) Date of Patent: Sep. 3, 2013

(54) METHOD AND APPARATUS FOR PERFORMING NONLINEARITY CALIBRATION

(75) Inventor: Yung-Hui Chung, Hsinchu (TW)

(73) Assignee: Mediatek Inc., Science-Based Industrial Park, Hsin-Chu (TW)

(*) Notice: Subject to any disclaimer, the term of this patent is extended or adjusted under 35 U.S.C. 154(b) by 56 days.

(21) Appl. No.: 13/167,713

(22) Filed: Jun. 24, 2011

(65) Prior Publication Data

US 2012/0326903 A1 Dec. 27, 2012

(51) Int. Cl.
*H03M 1/06* (2006.01)

(52) U.S. Cl.
USPC .......................................... 341/118; 341/120

(58) Field of Classification Search
USPC .................................. 341/118, 120, 144, 155
See application file for complete search history.

(56) References Cited

U.S. PATENT DOCUMENTS

| | | | | |
|---|---|---|---|---|
| 5,257,026 | A * | 10/1993 | Thompson et al. | 341/118 |
| 6,570,514 | B1 * | 5/2003 | Velazquez | 341/118 |
| 7,602,323 | B2 * | 10/2009 | Galton et al. | 341/118 |
| 7,773,009 | B2 * | 8/2010 | Rychen | 341/120 |

OTHER PUBLICATIONS

Boris Murmann, Bernhard E. Boser, "A 12-bit 75-MS/s Pipelined ADC Using Open-Loop Residue Amplification", IEEE Journal of Solid-State Circuits, vol. 38, No. 12, Dec. 2003, pp. 2040-2050, IEEE, USA.

Carl R. Grace, Paul J. Hurst, Stephen H. Lewis, "A 12-bit 80-MSample/s Pipelined ADC With Bootstrapped Digital Calibration", IEEE Journal of Solid-State Circuits, vol. 40, No. 5, May 2005, pp. 1038-1046, IEEE, USA.
Bibhu Datta Sahoo, Behzad Razavi, "A 12-Bit 200-MHz CMOS ADC", IEEE Journal of Solid-State Circuits, vol. 44, No. 9, Sep. 2009, pp. 2366-2380, IEEE, USA.
Andrea Panigada, Ian Galton, "A 130 mW 100 MS/s Pipelined ADC With 69 dB SNDR Enabled by Digital Harmonic Distortion Correction", IEEE Journal of Solid-State Circuits, vol. 44, No. 12, Dec. 2009, pp. 3314-3328, IEEE, USA.
Yung-Hui Chung, Jieh-Tsorng Wu, "A CMOS 6-mW 10-bit 100-MS/s Two-Step ADC", IEEE Journal of Solid-State Circuits, vol. 45, No. 11, Nov. 2010, pp. 2217-2226, IEEE, USA.

* cited by examiner

*Primary Examiner* — Brian Young
(74) *Attorney, Agent, or Firm* — Winston Hsu; Scott Margo

(57) ABSTRACT

A method for performing nonlinearity calibration includes the steps of: obtaining temporarily values of a plurality of compensation parameters by performing a perturbation-based calibration process on a nonlinear system with at least one predetermined input being applied to the nonlinear system; and updating the compensation parameters by performing the perturbation-based calibration process in an online manner, wherein the temporarily values are utilized as initial values of the compensation parameters for the step of updating the compensation parameters. In addition, the compensation parameters are utilized for controlling a compensation response of the perturbation-based calibration process. An associated apparatus is also provided.

17 Claims, 7 Drawing Sheets

METHOD AND APPARATUS FOR PERFORMING NONLINEARITY CALIBRATION

BACKGROUND

The present invention relates to access to performance control of a nonlinear system, and more particularly, to a method for performing nonlinearity calibration, and to an associated apparatus.

Nonlinearity of a component such as an analog-to-digital converter (ADC) is an issue in some applications. Although there are some solutions proposed by the related art in response to the problem of nonlinearity, some other problems may occur. For example, the related art algorithm may be too complicated, causing the chip area to be greatly increased. In another example, after power-on of a system comprising a conventional ADC, the conventional ADC cannot rapidly get ready for being used by the system. It seems unlikely that the related art provides a real solution having no side effect. Therefore, a novel method is required for performing nonlinearity calibration on a nonlinear system, in order to remove the influence of nonlinearity.

SUMMARY

It is therefore an objective of the claimed invention to provide a method for performing nonlinearity calibration, and to provide an associated apparatus, in order to solve the above-mentioned problems.

An exemplary embodiment of a method for performing nonlinearity calibration comprises the steps of: obtaining temporarily values of a plurality of compensation parameters by performing a perturbation-based calibration process on a nonlinear system with at least one predetermined input being applied to the nonlinear system; and updating the compensation parameters by performing the perturbation-based calibration process in an online manner, wherein the temporarily values are utilized as initial values of the compensation parameters for the step of updating the compensation parameters. In addition, the compensation parameters are utilized for controlling a compensation response of the perturbation-based calibration process.

An exemplary embodiment of an apparatus for performing nonlinearity calibration comprises a calibration loop and an input selector. The calibration loop is arranged to perform a perturbation-based calibration process, the calibration loop comprising a nonlinear system to be calibrated, wherein during performing compensation for the nonlinear system in the perturbation-based calibration process, a plurality of compensation parameters are utilized for controlling a compensation response. The input selector is arranged to select at least one input to be applied to the nonlinear system from at least one ordinary input and at least one predetermined input. In addition, the calibration loop is arranged to obtain temporarily values of the compensation parameters by performing the perturbation-based calibration process for the nonlinear system with the at least one predetermined input being applied to the nonlinear system. Additionally, the calibration loop is arranged to determine latest values of the compensation parameters by performing the perturbation-based calibration process in an online manner, wherein the temporarily values are utilized as initial values of the compensation parameters for online calibration.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1A:
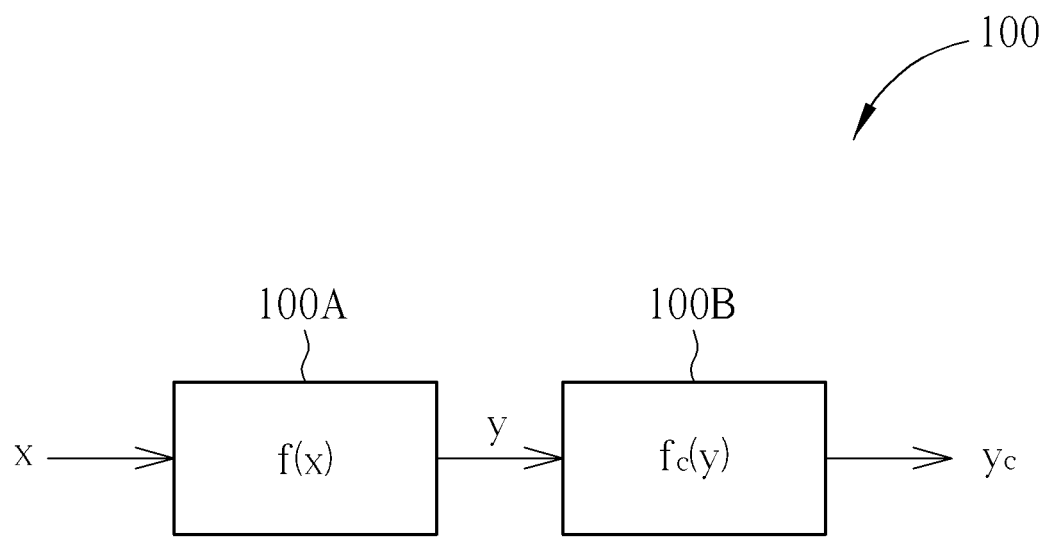
FIG. 1A is a diagram of an apparatus for performing nonlinearity calibration according to a first embodiment of the present invention.

Please refer to FIG. 1A, which illustrates a diagram of an apparatus 100 for performing nonlinearity calibration according to a first embodiment of the present invention. The apparatus 100 comprises a nonlinear system 100A and a compensation system 100B. The nonlinear system 100A performs an operation of a function f(x) on an input x to generate an output y, where the function f(x) is typically a nonlinear function. In order to correct the nonlinearity of the nonlinear system 100A, the compensation system 100B is arranged to perform an operation of a correction function $f_c(y)$ on the output y to generate a corrected output $y_c$. According to a first embodiment, in a situation where the compensation system 100B is properly designed, the nonlinear effect due to the nonlinearity of the nonlinear system 100A can be absent in the corrected output $y_c$. For example, the nonlinear function f(x) can be expressed in an approximation form as follows:

$$y = f(x) \approx \Sigma_{i1=0, 1, \ldots, I}(a_{i1} x^{i1});$$

where the notation $a_{i1}$ represents the coefficient of the term $x^{i1}$ in the above equation. In addition, the correction function $f_c(y)$ can be expressed in an approximation form as follows:

$$y_c = f_c(y) \approx \Sigma_{i=0, 1, \ldots, k}(b_i y^i) \approx x;$$

where the notation $b_i$ represents the coefficient of the term $y^i$ in the above equation, and can be regarded as a compensation parameter of the compensation system 100B.

Figure 1B:
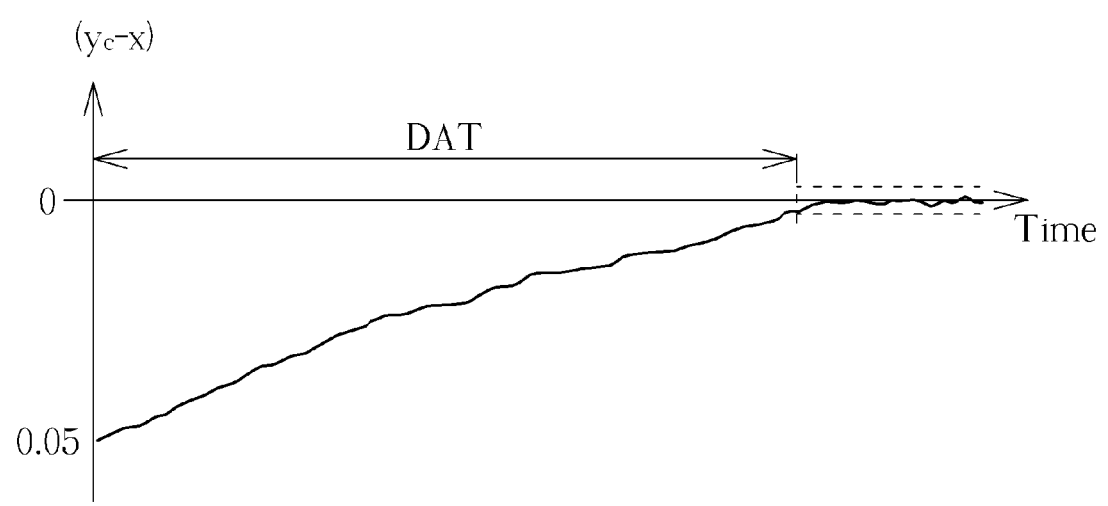
FIG. 1B illustrates a data available time (DAT) involved with the apparatus shown in FIG. 1A according to an embodiment of the present invention.

FIG. 1B illustrates a data available time (DAT) involved with the apparatus 100 shown in FIG. 1A according to an embodiment of the present invention. The horizontal axis represents time, while the vertical axis represents a difference ($y_c-x$) between the corrected output $y_c$ and the input x. In this embodiment, the curve shown in FIG. 1B indicates that the difference ($y_c-x$) approaches 0 within the DAT, where the DAT typically represents the time to make the corrected output $y_c$ (e.g. the corrected output data) approach the input x after power-on or waking up from a standby status.

Figure 2:
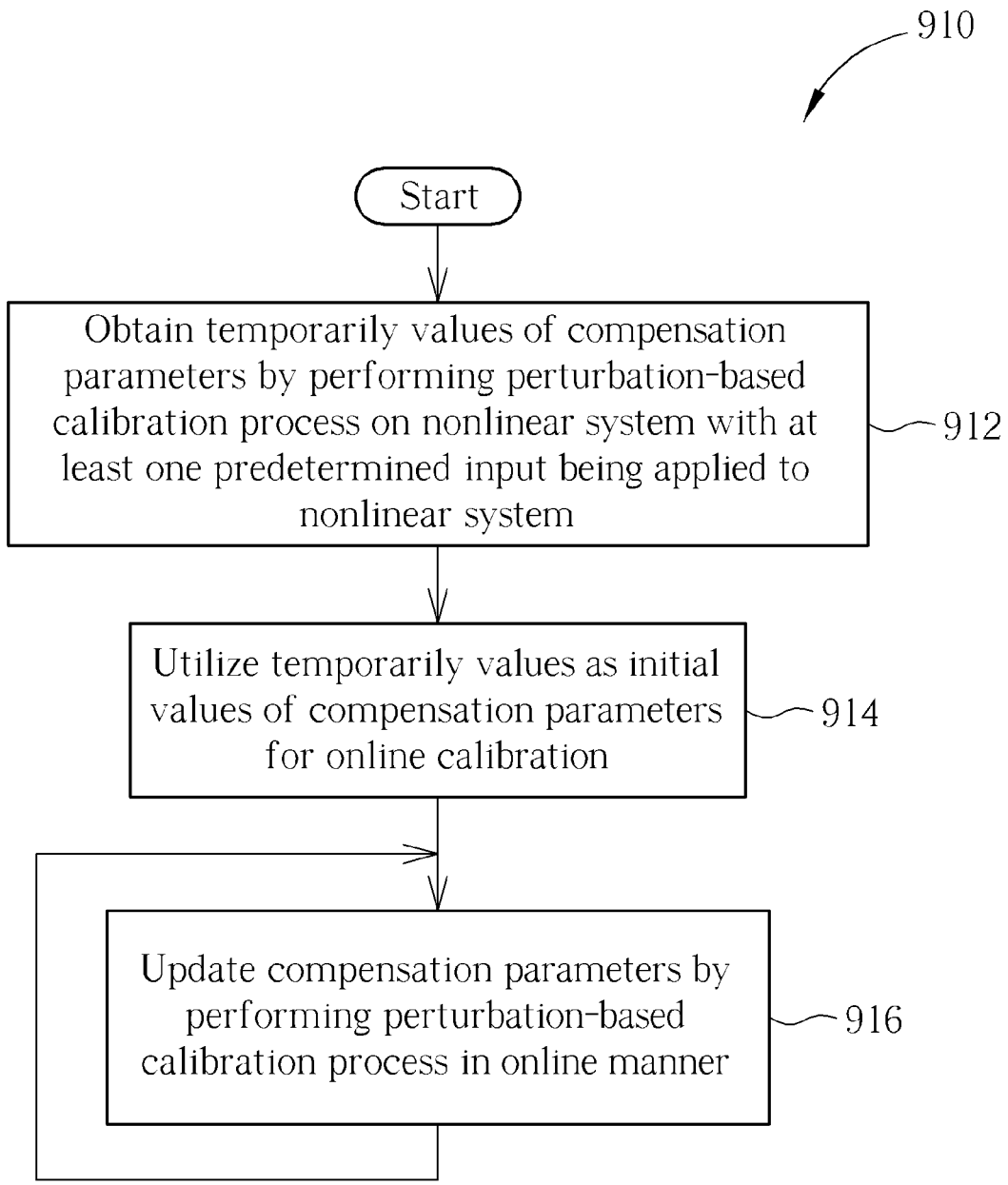
FIG. 2 is a flowchart of a method for performing nonlinearity calibration according to an embodiment of the present invention.

In practice, the DAT can be determined by detecting the time for the absolute value of the difference ($y_c-x$) to fall within a predetermined upper limit, where the upper limit may correspond to some standards that the apparatus 100 complies with. This is for illustrative purposes only, and is not meant to be a limitation of the present invention. According to some variations of this embodiment, in a situation where the apparatus 100 is an analog-to-digital converter (ADC), the DAT can be determined by detecting the time for the effective number of bits (ENOB) of the ADC to reach a predetermined value corresponding to some standards that the ADC complies with. For example, the apparatus 100 can be a 12 bit ADC, and the DAT can be determined by detecting the time for the ENOB of the 12 bit ADC to reach a predetermined value 11.5. Referring to FIG. 2, further details for rapidly obtaining correct values of the compensation parameters $\{b_i\}$ are described as follows.

FIG. 2 is a flowchart of a method 910 for performing nonlinearity calibration according to an embodiment of the present invention. The method 910 can be applied to the apparatus 100 shown in FIG. 1A, and more particularly, to the compensation system 100B mentioned above. For example, referring to FIG. 3, the apparatus 100 comprises an input selector 110 and a calibration loop arranged to perform a perturbation-based calibration process, with the calibration loop comprising an arithmetic unit 120 (e.g. an adder), a nonlinear system 130 to be calibrated, a compensation module 140, an estimation module 150, and a perturbation generator 160, where the input selector 110, the arithmetic unit 120, and the nonlinear system 130 can be regarded as the nonlinear system 100A shown in FIG. 1A, and the compensation module 140, the estimation module 150, and the perturbation generator 160 can be regarded as the compensation system 100B shown in FIG. 1A. The method is described as follows.

In Step 912, the calibration loop mentioned above obtains temporarily values of a plurality of compensation parameters $\{b_i\}$ by performing the perturbation-based calibration process on the nonlinear system 130 with at least one predetermined input $x_0$ being applied to the nonlinear system 130. In particular, during performing compensation on the nonlinear system 130 in the perturbation-based calibration process, the compensation parameters $\{b_i\}$ are utilized for controlling the compensation response of the perturbation-based calibration process, and more particularly, the compensation response of the compensation module 140.

Figure 3:
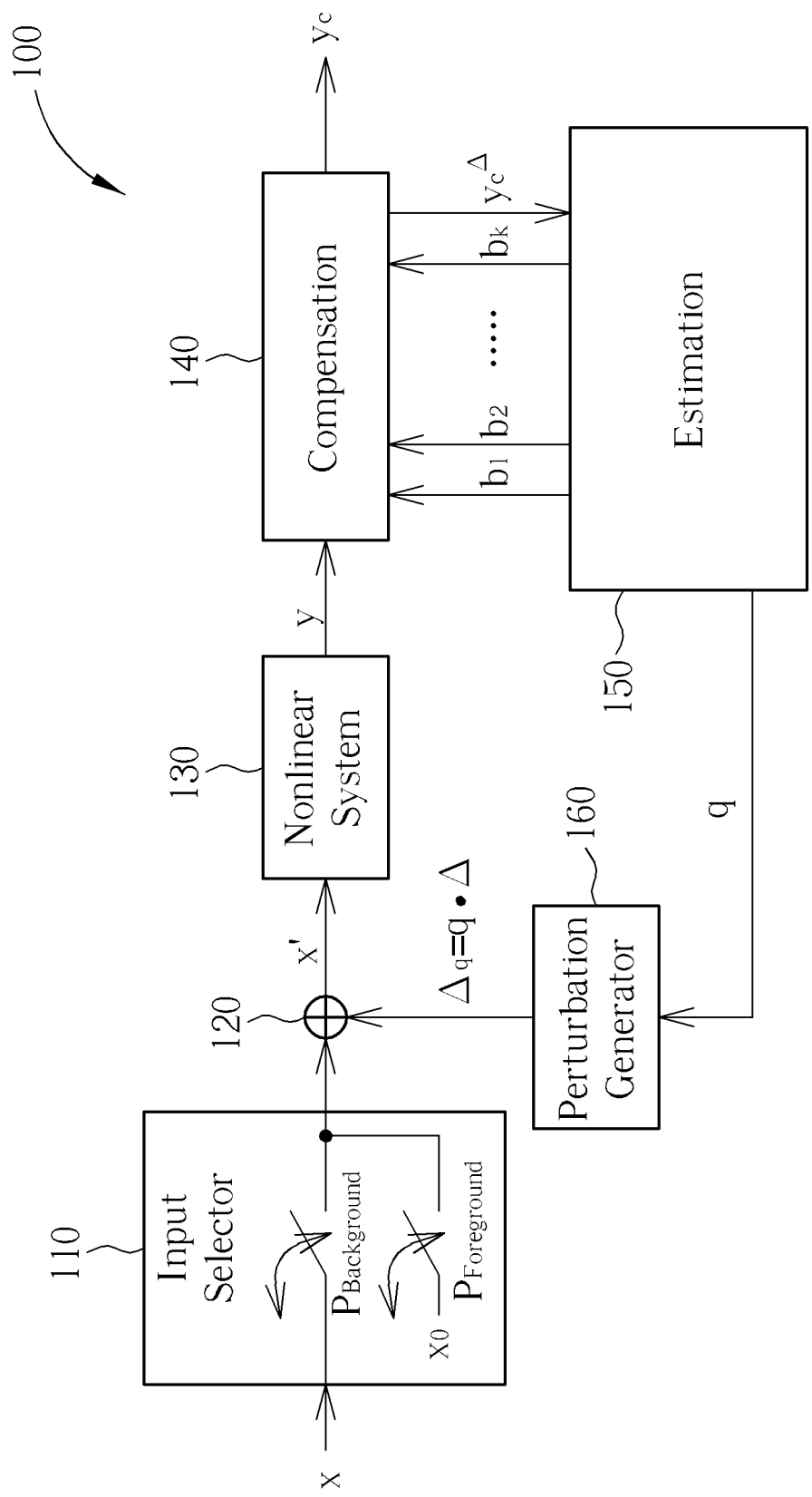
FIG. 3 illustrates some implementation details of the apparatus shown in FIG. 1A according to an embodiment of the present invention.

As shown in FIG. 3, the input selector 110 is arranged to select at least one input to be applied to the nonlinear system 130 from at least one ordinary input x and the aforementioned at least one predetermined input $x_0$. Please note that the aforementioned at least one ordinary input x typically represents the input that the apparatus 100 shown in FIG. 3 handles in its normal operation, and therefore, the aforementioned at least one ordinary input x can be at least one arbitrary input such as at least one non-predetermined input. According to this embodiment, in a foreground calibration mode, the input selector 110 selects the predetermined input $x_0$ on the path $P_{Foreground}$ as the input to be applied to the nonlinear system 130. In addition, in a background calibration mode, the input selector 110 selects the ordinary input x on the path $P_{Background}$ as the input to be applied to the nonlinear system 130. Thus, Step 912 is performed in the foreground calibration mode.

In Step 914, the calibration loop utilizes the temporarily values (i.e. those mentioned in Step 912) as initial values of the compensation parameters $\{b_i\}$ for online calibration, which means the calibration loop utilizes the temporarily values mentioned above as the initial values of the compensation parameters $\{b_i\}$ in the background calibration mode. More particularly, when it is detected that the absolute value of the difference ($y_c-x$) falls within the aforementioned predetermined upper limit, Step 914 is entered. This is for illustrative purposes only, and is not meant to be a limitation of the present invention. According to some variations of the embodiment shown in FIG. 2, in a situation where the apparatus 100 is the ADC mentioned in the variations of the embodiment shown in FIG. 1B, when it is detected that the ENOB of the ADC reaches the aforementioned predetermined value corresponding to some standards that the ADC complies with, Step 914 is entered. For example, the apparatus 100 can be the 12 bit ADC mentioned above, and when it is detected that the ENOB of the 12 bit ADC reaches the predetermined value 11.5, Step 914 is entered.

In Step 916, the calibration loop updates the compensation parameters $\{b_i\}$ by performing the perturbation-based calibration process in an online manner. More particularly, the calibration loop determines the latest values of the compensation parameters $\{b_i\}$ by performing the perturbation-based calibration process in the online manner, having no need to apply any predetermined input (e.g. the aforementioned at least one predetermined input $x_0$) to the nonlinear system after a DAT, such as the aforementioned DAT of the embodiment shown in FIG. 1B. Thus, Step 916 is performed in the background calibration mode mentioned above. Please note that, when Step 916 is entered, applying a predetermined input such as the aforementioned at least one predetermined input $x_0$ to the nonlinear system is not required. This is for illustrative purposes only, and is not meant to be a limitation of the present invention. According to some variations of this embodiment, after the perturbation-based calibration process is performed in the online manner for a while, a predetermined input such as the aforementioned at least one predetermined input $x_0$ may intentionally be applied to the nonlinear system when needed. According to some variations of this embodiment, no predetermined input is applied to the nonlinear system once the background calibration mode mentioned above is entered.

According to the embodiment shown in FIG. 2, with the proposed scheme/architecture shown in FIG. 3 being applied, the perturbation generator 160 is arranged to generate a set of perturbation values $\{\Delta_q\}$, where $\Delta_q=(q\cdot\Delta)$, and the value q sent from the estimation module 150 is selected from the set $\{-1, 0, 1\}$ in this embodiment. Please note that the set $\{-1, 0, 1\}$ is taken as an example of the set from which the value q is selected. This is for illustrative purposes only, and is not meant to be a limitation of the present invention. According to variations of this embodiment, the set from which the value q is selected may be formed with other combinations of values. For example, the set may comprise three or more values, each of which may be different from any of the others within the three or more values.

In the embodiment shown in FIG. 2, with the proposed scheme/architecture shown in FIG. 3 being applied, the arithmetic unit 120 is arranged to combine the set of perturbation values $\{\Delta_q\}$ into the aforementioned at least one input to be applied to the nonlinear system 130 (e.g. the aforementioned at least one predetermined input $x_0$, or the aforementioned at least one ordinary input x). As shown in FIG. 3, the notation x' is utilized for representing the combined input, i.e. the input carrying a perturbation value $\Delta_q$ of the set of perturbation values $\{\Delta_q\}$. The arithmetic unit 120 is arranged to apply (or input) the input carrying the set of perturbation values $\{\Delta_q\}$ (more particularly, the combined input {x'}) to the nonlinear system 130, in order to obtain a set of outputs {y} of the nonlinear system 130, respectively. In addition, the compensation module 140 is arranged to perform compensation on the set of outputs {y} according to the compensation parameters $\{b_i\}$, in order to obtain a set of compensated results, such as the superset $\{\{y_c^\Delta\}, \{y_c\}\}$ of the compensated results $\{y_c^\Delta\}$ corresponding to the set of perturbation values $\{\Delta_q\}$ and the compensated results $\{y_c\}$ carrying no influence of the set of perturbation values $\{\Delta_q\}$. Additionally, the estimation module 150 is arranged to perform estimation according to the compensated results $\{y_c^\Delta\}$ corresponding to the set of perturbation values $\{\Delta_q\}$ within the set of compensated results $\{\{y_c^\Delta\}, \{y_c\}\}$, in order to determine/update the compensation parameters $\{b_i\}$ for performing compensation.

Please note that, in the compensated results $\{y_c\}$ of the embodiment shown in FIG. 2, influence of the set of perturbation values $\{\Delta_q\}$ is removed. On the contrary, in at least a portion (e.g. a portion or all) of the compensated results $\{y_c^\Delta\}$ corresponding to the set of perturbation values $\{\Delta_q\}$, influence of the set of perturbation values $\{\Delta_q\}$ is not removed. For example, in a situation where $\Delta_q = (q \cdot \Delta)$ and the value q sent from the estimation module 150 is selected from the set $\{-1, 0, 1\}$, at least a portion of the compensated results $\{y_c^\Delta\}$, and more particularly, those corresponding to the perturbation values $\{-1, 1\}$, carry influence of the perturbation values $\{-1, 1\}$, respectively. In addition, another portion of the compensated results $\{y_c^\Delta\}$, and more particularly, that corresponding to the perturbation value $\{0\}$, intrinsically carries no influence of the perturbation value $\{0\}$ since there should be no influence of any perturbation value that is zero. This is for illustrative purposes only, and is not meant to be a limitation of the present invention. According to some variations of this embodiment, in a situation where none of the set of perturbation values $\{\Delta_q\}$ is zero, the compensated results $\{y_c^\Delta\}$ surely carry influence of the perturbation values $\{\Delta_q\}$, respectively.

Regarding Step 912 performed in the foreground calibration mode mentioned above, in a situation where the aforementioned at least one predetermined input $x_0$ is applied to the nonlinear system 130, the arithmetic unit 120 is arranged to combine the set of perturbation values $\{\Delta_q\}$ into the aforementioned at least one predetermined input $x_0$, and is arranged to apply (or input) the predetermined input carrying the set of perturbation values $\{\Delta_q\}$ (more particularly, the combined predetermined input $\{x_0'\}$ in this situation) to the nonlinear system 130, in order to determine the temporarily values of the compensation parameters $\{b_i\}$. Regarding Step 916 performed in the background calibration mode mentioned above, in a situation where the aforementioned at least one ordinary input x is applied to the nonlinear system 130, the arithmetic unit 120 is arranged to combine the same set of perturbation values $\{\Delta_q\}$ into the aforementioned at least one ordinary input x, and is arranged to apply (or input) the ordinary input carrying the set of perturbation values $\{\Delta_q\}$ (more particularly, the combined ordinary input {x'} in this situation) to the nonlinear system 130, in order to determine the latest values of the compensation parameters $\{b_i\}$. This is for illustrative purposes only, and is not meant to be a limitation of the present invention. According to some variations of this embodiment, the calibration loop can utilize different sets of perturbation values, such as a first set of perturbation values $\{\Delta_{q\_Foreground}\}$ and a second set of perturbation values $\{\Delta_{q\_Background}\}$, in the foreground calibration mode and the background calibration mode, respectively.

As both $a_0$ of $\{a_{i1}\}$ and $b_0$ of $\{b_i\}$ can be zero in the embodiment shown in FIG. 2, the equivalent functions of the nonlinear system 130 and the compensation module 140 can be written as $f(x', a_1, a_2, \ldots, a_j)$ and $f_c(y, b_1, b_2, \ldots, b_k)$, respectively. In addition, as illustrated in FIG. 3, only a portion of compensation parameters $\{b_1, b_2, \ldots, b_k\}$ are taken as examples of the compensation parameters $\{b_i\}$ sent from the estimation module 150 to the compensation module 140. This is for illustrative purposes only, and is not meant to be a limitation of the present invention. According to some variations of this embodiment, in a situation where none of $\{b_i\}$ is zero, it can be illustrated in FIG. 3 that the compensation parameters $\{b_i\}$ sent from the estimation module 150 to the compensation module 140 comprises all of the compensation parameters $\{b_0, b_1, b_2, \ldots, b_k\}$.

According to an embodiment, such as a variation of the embodiment shown in FIG. 2, the estimation module 150 can perform estimation such as Lyapunov-based estimation according to the compensated results $\{y_c^\Delta\}$ in order to determine/update the compensation parameters $\{b_i\}$, where the Lyapunov-based estimation can be performed according to the following equations:

$b_i[n+1]=L_i(b_i[n],x_0)$, for the foreground calibration mode; and $b_i[n+1]=L_i(b_i[n],E[x])$, for the background calibration mode;

where the notation n represents an iteration index, and the notations $L_i(\bullet)$ and $E[\bullet]$ respectively represent an estimation function and an operation of mean calculation (e.g. a moving average operation).

Figure 4:
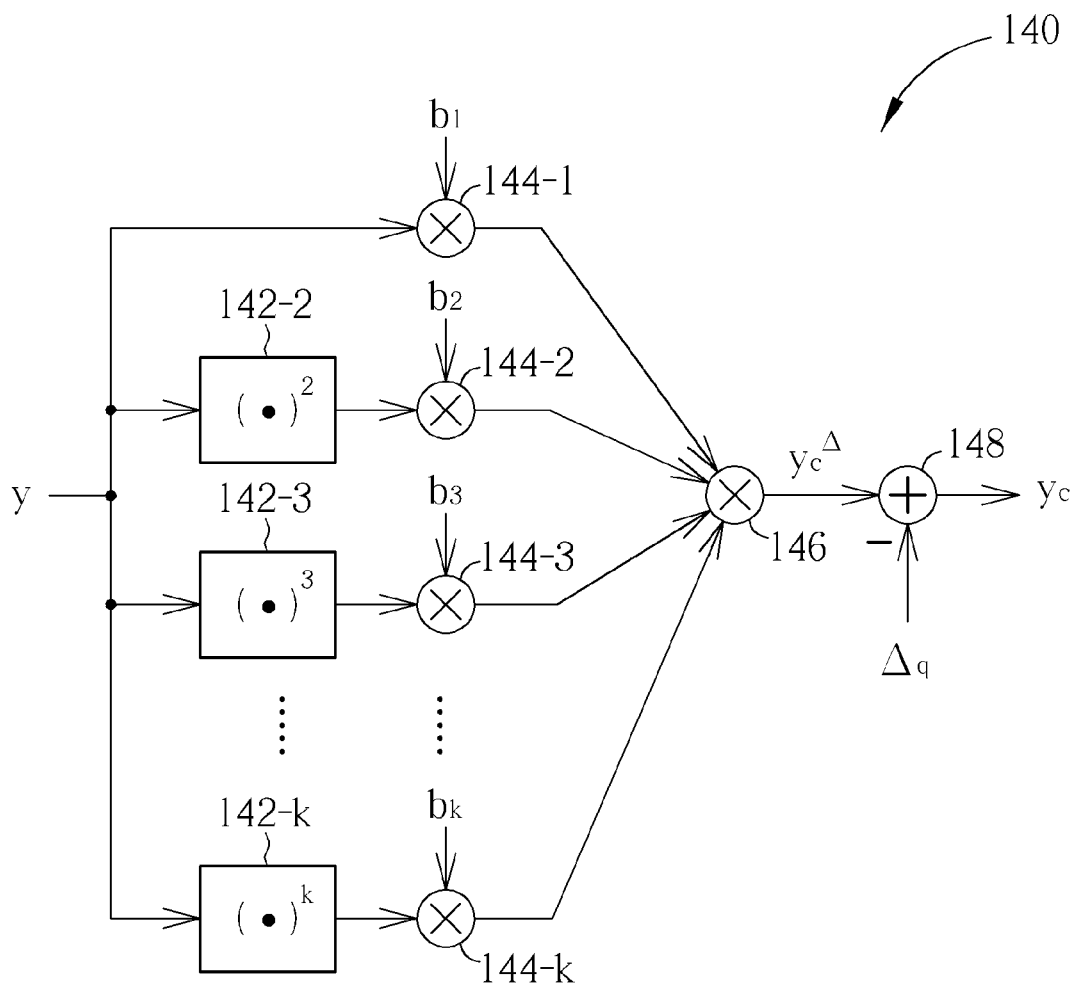
FIG. 4 illustrates some implementation details of the compensation module shown in FIG. 3 according to an embodiment of the present invention.

FIG. 4 illustrates some implementation details of the compensation module 140 shown in FIG. 3 according to an embodiment of the present invention. The compensation module 140 comprises a plurality of first arithmetic units 142-2, 142-3, . . . , and 142-k (e.g. power calculation units), a plurality of second arithmetic units 144-1, 144-2, 144-3, . . . , and 144-k (e.g. multipliers), a third arithmetic unit 146 (e.g. an adder), and a fourth arithmetic unit 148 (e.g. a subtraction unit). The first arithmetic units 142-2, 142-3, . . . , and 142-k calculate $y^2, y^3, \ldots,$ and $y^k$, respectively. In addition, the second arithmetic units 144-1, 144-2, 144-3, . . . , and 144-k calculate $(b_1 \cdot y), (b_2 \cdot y^2), (b_3 \cdot y^3), \ldots,$ and $(b_k \cdot y^k)$, respectively. As a result of the arrangement shown in FIG. 4, the compensation module 140 can obtain any compensated result $y_c^\Delta$ or any compensated result $y_c$ within the set of compensated results $\{\{y_c^\Delta\}, \{y_c\}\}$ mentioned above.

More specifically, the compensation module 140 can calculate the compensated result $y_c^\Delta$ and the compensated result $y_c$ according to the following equations:

$y_c^\Delta = \Sigma_{i=1, 2, \ldots, k}(b_i y^i)$; and $y_c = y_c^\Delta - \Delta_q$.

This is for illustrative purposes only, and is not meant to be a limitation of the present invention. According to some variations of this embodiment, in general, the compensated result $y_c^\Delta$ can be expressed as follows:

$$y_c^\Delta = f_c(y, b_1, b_2, \ldots, b_k);$$

where the format of the function $f_c(y, b_1, b_2, \ldots, b_k)$ may be arbitrary.

Figure 5A:
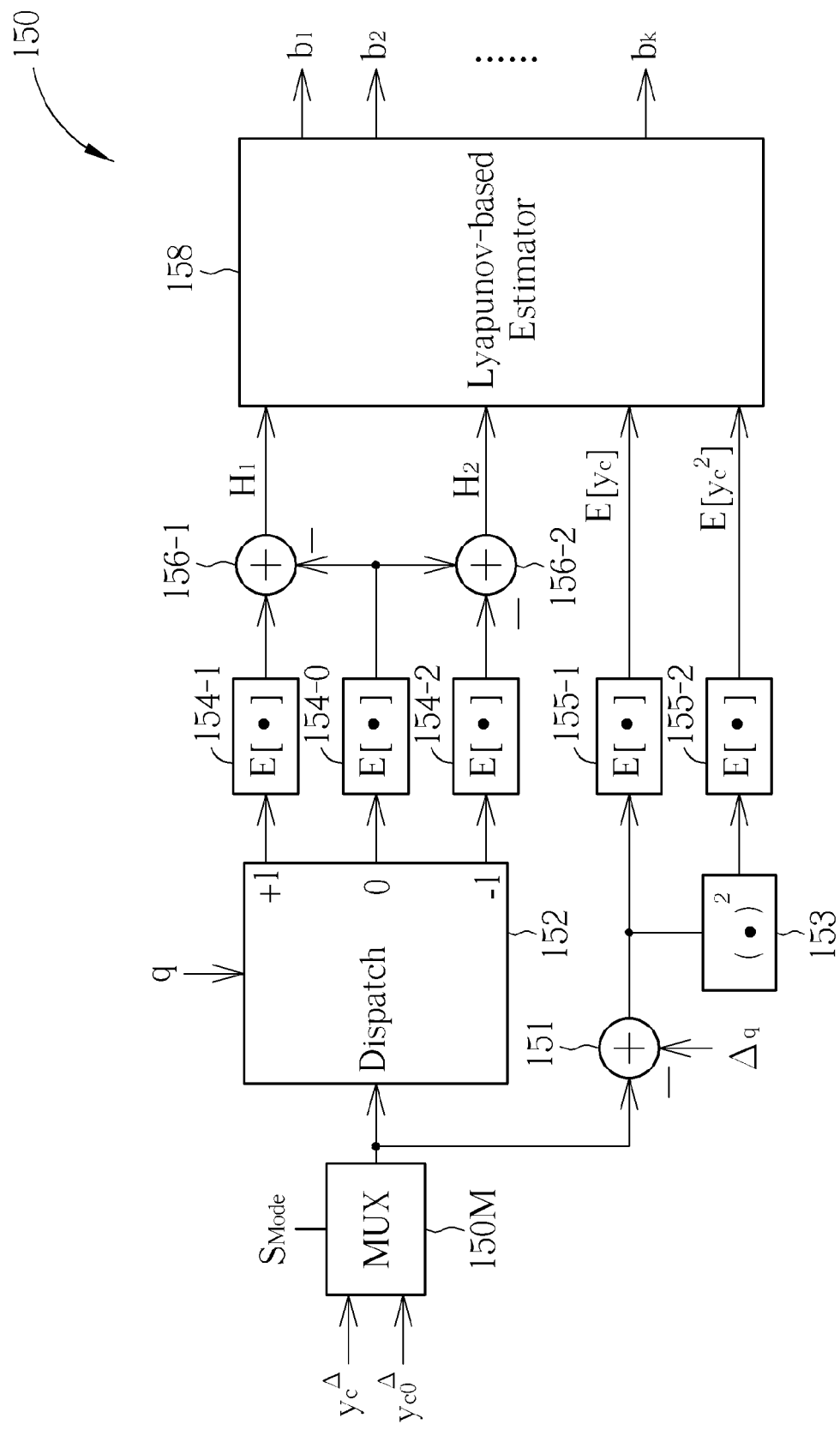
FIG. 5A illustrates some implementation details of the estimation module shown in FIG. 3 according to an embodiment of the present invention.

FIG. 5A illustrates some implementation details of the estimation module 150 shown in FIG. 3 according to an embodiment of the present invention. The estimation module 150 comprises a multiplexer 150M (labeled "MUX" in FIG. 5A), a dispatch unit 152 (labeled "Dispatch" in FIG. 5A), a first set of mean calculation units 154-0, 154-1, and 154-2, a plurality of fourth arithmetic units 156-1 and 156-2 (e.g. subtraction units), and a Lyapunov-based estimator 158, and further comprises a fourth arithmetic unit 151 (e.g. a subtraction unit), a first arithmetic unit 153 (e.g. a power calculation unit such as a square calculation unit), and a second set of mean calculation units 155-1 and 155-2.

Figure 5B:
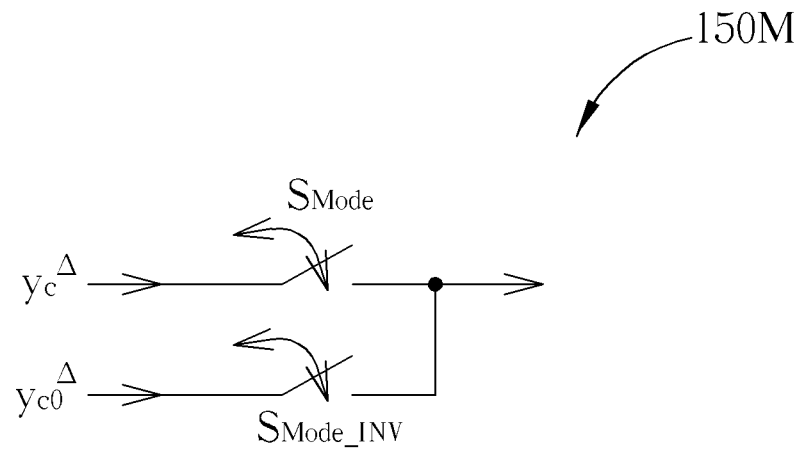
FIG. 5B illustrates some implementation details of the multiplexer shown in FIG. 5A according to an embodiment of the present invention.

Please note that, in the above embodiments such as those shown in FIGS. 2-4, the compensated results $\{y_c^\Delta\}$ may comprise those obtained by utilizing the aforementioned at least one ordinary input x and comprise those obtained by utilizing the aforementioned at least one predetermined input $x_0$. According to this embodiment, for better comprehension, a portion of compensated results within the compensated results $\{y_c^\Delta\}$ can be re-written as the compensated results $\{y_{c0}^\Delta\}$ in a situation where they are obtained by utilizing the aforementioned at least one predetermined input $x_0$, rather than the aforementioned at least one ordinary input x. As shown in FIG. 5A, the multiplexer 150M is arranged to select a compensated result from the compensated result $y_c^\Delta$ and the compensated result $y_{c0}^\Delta$ according to the selection signal $S_{Mode}$. More particularly, referring to FIG. 5B, in a situation where the selection signal $S_{Mode}$ is in an active state and the inverted signal $S_{Mode\_INV}$ thereof is in an inactive state, the multiplexer 150M selects the compensated result $y_c^\Delta$. On the contrary, in a situation where the selection signal $S_{Mode}$ is in an inactive state and the inverted signal $S_{Mode\_INV}$ thereof is in an active state, the multiplexer 150M selects the compensated result $y_{c0}^\Delta$.

Regarding the upper paths shown in FIG. 5A, as the value q sent from the estimation module 150 is selected from the set $\{-1, 0, 1\}$ in this embodiment, the dispatch unit 152 dispatches the output of the multiplexer 150M to three output terminals respectively corresponding to the values in the set $\{-1, 0, 1\}$ (more particularly, the output terminals respectively labeled "−1", "0", and "+1" in the dispatch unit 152 shown in FIG. 5A) according to the value q. For example, the dispatch unit 152 may dispatch the output of the multiplexer 150M to the output terminal labeled "−1" in a situation where q=−1, or dispatch the output of the multiplexer 150M to the output terminal labeled "0" in a situation where q=0, or dispatch the output of the multiplexer 150M to the output terminal labeled "+1" in a situation where q=1. In addition, the first set of mean calculation units 154-0, 154-1, and 154-2 perform operations of mean calculation (e.g. moving average operations) on the compensated results received from the output terminals labeled "0", "+1", and "−1", respectively. Additionally, the fourth arithmetic units 156-1 and 156-2 calculate some linear combinations $H_1$ and $H_2$ of the means output from the first set of mean calculation units 154-0, 154-1, and 154-2, respectively. More particularly, the fourth arithmetic unit 156-1 obtains the linear combination $H_1$ by calculating the difference between the means respectively output from the mean calculation units 154-1 and 154-0, and the fourth arithmetic unit 156-2 obtains the linear combination $H_2$ by calculating the difference between the means respectively output from the mean calculation units 154-0 and 154-2. This is for illustrative purposes only, and is not meant to be a limitation of the present invention. According to some variations of this embodiment, in a situation where the number of the perturbation values $\{\Delta_q\}$ (or the number of possible values of q) is increased and the number of associated output terminals of the dispatch unit 152 is correspondingly increased, the number of linear combinations to be sent to the Lyapunov-based estimator 158 can be increased. For example, the aforementioned linear combinations $\{H_1, H_2\}$ can be extended to be $\{H_1, H_2, \ldots, H_m\}$ in these variations.

Regarding the lower paths shown in FIG. 5A, the fourth arithmetic unit 151 can calculate the compensated result $y_c$ by subtracting the perturbation value $\Delta_q$ from the compensated result $y_c^\Delta$ (and/or $y_{c0}^\Delta$). In addition, the first arithmetic unit 153 calculates $y_c^2$, and the second set of mean calculation units 155-1 and 155-2 perform operations of mean calculation (e.g. moving average operations) on the outputs of the fourth arithmetic unit 151 and the first arithmetic unit 153, in order to obtain the means $E[y_c]$ and $E[y_c^2]$, respectively. As a result of the arrangement shown in FIG. 5A, the Lyapunov-based estimator 158 can perform Lyapunov-based estimation according to derivatives of some compensated results $\{y_c^\Delta\}$ (and/or $\{y_{c0}^\Delta\}$) obtained by performing compensation on the nonlinear system 130, such as the linear combinations $\{H_1, H_2\}$ and the means $E[y_c]$ and $E[y_c^2]$, in order to determine/update the compensation parameters $\{b_i\}$ mentioned in Step 912 or Step 916.

Figure 5C:
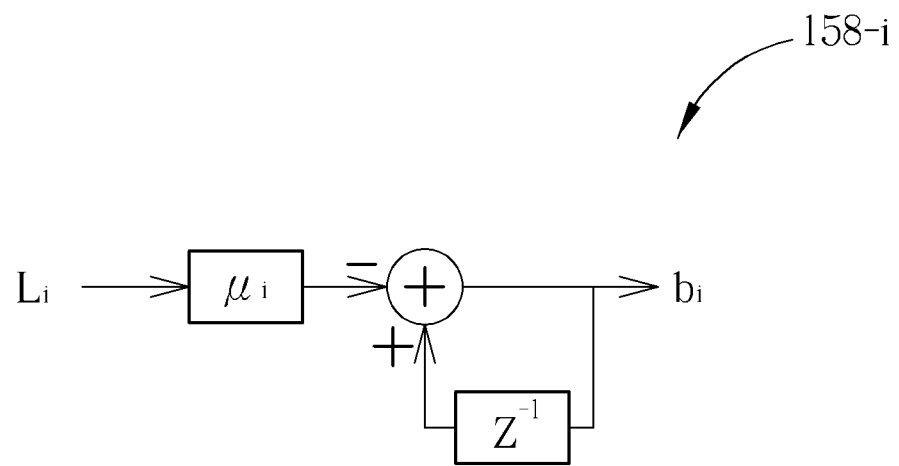
FIG. 5C illustrates some implementation details involved with the Lyapunov-based estimator shown in FIG. 5A according to an embodiment of the present invention.

According to a variation of the embodiment shown in FIG. 2, such as the embodiment shown in FIG. 5C, the aforementioned derivatives of the compensated results $\{y_c^\Delta\}$ (and/or $\{y_{c0}^\Delta\}$) comprise linear combinations $\{H_j\}$ of means of different portions of the compensated results $\{y_c^\Delta\}$ (and/or $\{y_{c0}^\Delta\}$), respectively. Regarding the linear combinations $\{H_j\}$, the suffix j represents an index of measurement for the Lyapunov-based estimation. For example, the index j may vary from 1 to m, and the linear combinations $\{H_j\}$ comprise $\{H_1, H_2, \ldots, H_m\}$, which can be regarded as m measurement results. Thus, the Lyapunov-based estimator 158 can perform Lyapunov-based estimation according to derivatives of some compensated results $\{y_c^\Delta\}$ (and/or $\{y_{c0}^\Delta\}$) obtained by performing compensation on the nonlinear system 130, such as the linear combinations $\{H_1, H_2, \ldots, H_m\}$ in order to determine/update the compensation parameters $\{b_i\}$ mentioned in Step 912 or Step 916.

More particularly, in a situation where notations $\Delta$, n, and $\mu_i$ of this embodiment respectively represent a perturbation value, an iteration index, and an updating factor, the Lyapunov-based estimator 158 is arranged to perform the Lyapunov-based estimation according to the following equations:

$$E_j = H_j - \Delta; \text{ and}$$

$$b_i[n+1] = b_i[n] - (\mu_i \cdot L_i);$$

where the estimation function $L_i$ of this embodiment is a summation of products associated to both $\{E_j\}$ and the compensation parameter $b_i$. In practice, the estimation function L can be expressed as follows:

$$L_i = \Sigma_{j1=1, 2, \ldots, m}(E_{j1} \cdot (\partial E_{j1}/\partial b_i));$$

where the original suffix j of the aforementioned $E_j$ may be replaced by another notation j1 in the above equation, in order to prevent this equation from clashing with the aforementioned $E_j$.

According to some embodiments, such as the embodiments/variations disclosed above, as the difference ($y_c-x$) such as that shown in FIG. 1B usually approaches 0 after the operations disclosed in Step 912 are completed, the DAT of the present invention is typically the overall time for performing the operations disclosed in Step 912 in the foreground calibration mode, and is much shorter than that of the related art. For example, the ratio of the DAT of some embodiments of the present invention to that of a correlation-based calibration method of the related art is less than 1/10000. In another example, the ratio of the DAT of some embodiments of the present invention to that of another correlation-based calibration method of the related art is less than 1/1000.

It is an advantage of the embodiments of the present invention that, after power-on of a system comprising a component (e.g. an ADC) implemented, the component can rapidly get ready for being used by the system. The embodiments can properly remove the influence of nonlinearity and greatly reduce the DAT.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing nonlinearity calibration, the method comprising the steps of:
    obtaining temporarily values of a plurality of compensation parameters by performing a perturbation-based calibration process on a nonlinear system with at least one predetermined input being applied to the nonlinear system; and
    updating the compensation parameters by performing the perturbation-based calibration process in an online manner, wherein the temporarily values are utilized as initial values of the compensation parameters for the step of updating the compensation parameters;
    wherein the compensation parameters are utilized for controlling a compensation response of the perturbation-based calibration process.

2. The method of claim 1, wherein the perturbation-based calibration process comprises:
    applying a set of perturbation values to at least one input of the nonlinear system to generate a set of outputs;
    performing compensation on the set of outputs according to the compensation parameters to obtain a set of compensated results; and
    performing estimation according to the set of compensated results to update the compensation parameters.

3. The method of claim 2, wherein the step of obtaining the temporarily values further comprises:
    combining the set of perturbation values into the at least one predetermined input; and
    inputting the combined predetermined input to the nonlinear system to determine the temporarily values.

4. The method of claim 3, wherein the step of updating the compensation parameters further comprises:
    combining the set of perturbation values into at least one ordinary input of the nonlinear system, wherein the steps of obtaining the temporarily values and updating the compensation parameters utilize the same set of perturbation values; and
    inputting the combined ordinary input to the nonlinear system to determine the updated compensation parameters.

5. The method of claim 2, wherein the step of updating the compensation parameters further comprises:
    combining the set of perturbation values into at least one ordinary input of the nonlinear system; and
    inputting the combined ordinary input to the nonlinear system to determine the updated compensation parameters.

6. The method of claim 5, wherein the at least one ordinary input represents at least one non-predetermined input.

7. The method of claim 2, wherein one of the perturbation values is zero.

8. The method of claim 2, wherein the step of performing the estimation further comprises:
    performing Lyapunov-based estimation according to derivatives of the set of compensated results to update the compensation parameters.

9. The method of claim 8, wherein in a situation where a notation $b_i$ represents a compensation parameter of the compensation parameters, with the suffix i representing an index of the compensation parameters, the derivatives of the set of compensated results comprise linear combinations $\{H_j\}$ of means of different portions of the compensated results, respectively, where the suffix j represents an index of measurement for the Lyapunov-based estimation; and in a situation where notations $\Delta$, n, and $\mu_i$ respectively represent a perturbation value, an iteration index, and an updating factor, the Lyapunov-based estimation is performed according to the following equations:

$$E_j = H_j \cdot \Delta; \text{ and}$$

$$b_i[n+1] = b_i[n] - (\mu_i \cdot L_i);$$

where $L_i$ is a summation of products associated to both $\{E_j\}$ and the compensation parameter $b_i$.

10. An apparatus for performing nonlinearity calibration, the apparatus comprising:
    a calibration loop arranged to perform a perturbation-based calibration process, the calibration loop comprising a nonlinear system to be calibrated, wherein a plurality of compensation parameters are utilized for controlling a compensation response of the perturbation-based calibration process; and
    an input selector arranged to select at least one input to be applied to the nonlinear system from at least one ordinary input and at least one predetermined input;
    wherein the calibration loop is arranged to obtain temporarily values of the compensation parameters by performing the perturbation-based calibration process on the nonlinear system with the at least one predetermined input being applied to the nonlinear system; and
    the calibration loop is arranged to update the compensation parameters by performing the perturbation-based calibration process in an online manner, wherein the temporarily values are utilized as initial values of the compensation parameters for updating the compensation parameters.

11. The apparatus of claim 10, wherein the calibration loop further comprises:
    a perturbation generator arranged to generate a set of perturbation values;
    an arithmetic unit arranged to combine the set of perturbation values into the at least one input to be applied to the nonlinear system, wherein the arithmetic unit is arranged to apply the input carrying the set of perturbation values to the nonlinear system to obtain a set of outputs of the nonlinear system, respectively;
    a compensation module arranged to perform compensation on the set of outputs according to the compensation parameters to obtain a set of compensated results; and an estimation module arranged to perform estimation according to the set of compensated results to determine/update the compensation parameters.

12. The apparatus of claim 11, wherein in a situation where the at least one predetermined input is applied to the nonlinear system, the arithmetic unit is arranged to combine the set of perturbation values into the at least one predetermined input, and is arranged to input the combined predetermined input to the nonlinear system to determine the temporarily values.

13. The apparatus of claim 12, wherein in a situation where the at least one ordinary input is applied to the nonlinear system, the arithmetic unit is arranged to combine the set of perturbation values into the at least one ordinary input, and is arranged to input the combined ordinary input to the nonlinear system to determine the updated compensation parameters; and operations of obtaining the temporarily values and updating the compensation parameters utilize the same set of perturbation values.

14. The apparatus of claim 11, wherein in a situation where the at least one ordinary input is applied to the nonlinear system, the arithmetic unit is arranged to combine the set of perturbation values into the at least one ordinary input, and is arranged to input the combined ordinary input to the nonlinear system to determine the updated compensation parameters.

15. The apparatus of claim 11, wherein influence of the set of perturbation values is not removed from the set of compensated results.

16. The apparatus of claim 11, wherein the estimation module comprises:
  a Lyapunov-based estimator arranged to perform Lyapunov-based estimation according to derivatives of the set of compensated results to determine/update the compensation parameters.

17. The apparatus of claim 10, wherein the at least one ordinary input represents at least one non-predetermined input.

* * * * *